(12) United States Patent
Yagi

(10) Patent No.: US 6,815,969 B2
(45) Date of Patent: Nov. 9, 2004

(54) SEMICONDUCTOR INSPECTION DEVICE CAPABLE OF PERFORMING VARIOUS INSPECTIONS ON A SEMICONDUCTOR DEVICE

(75) Inventor: Kenya Yagi, Tokyo (JP)

(73) Assignee: Renesas Technology Corp., Tokyo (JP)

(*) Notice: Subject to any disclaimer, the term of this patent is extended or adjusted under 35 U.S.C. 154(b) by 6 days.

(21) Appl. No.: 10/225,124

(22) Filed: Aug. 22, 2002

(65) Prior Publication Data
US 2003/0062917 A1 Apr. 3, 2003

(30) Foreign Application Priority Data
Sep. 28, 2001 (JP) .................................. 2001-302586

(51) Int. Cl.[7] .............................................. G01R 31/26
(52) U.S. Cl. ....................... 324/765; 324/158.1; 700/121
(58) Field of Search .......................... 324/754, 755, 324/757, 758, 765, 158.1; 702/118, 121; 700/109, 110, 115, 116, 121, 219, 221–225

(56) References Cited

U.S. PATENT DOCUMENTS 5,497,079 A * 3/1996 Yamada et al. ........... 324/158.1
5,600,257 A * 2/1997 Leas et al. .................... 324/754
5,805,472 A * 9/1998 Fukasawa ..................... 702/118
6,275,051 B1 * 8/2001 Bachelder et al. ........... 324/754

FOREIGN PATENT DOCUMENTS

JP          2-103947          4/1990

* cited by examiner

*Primary Examiner*—Evan Pert
*Assistant Examiner*—Russell M. Kobert
(74) *Attorney, Agent, or Firm*—McDermott Will & Emery LLP

(57) ABSTRACT

A semiconductor inspection device inspects a semiconductor device to determine whether the semiconductor device is good or bad. The semiconductor inspection device has a semiconductor inspection unit including first to M-th semiconductor inspection circuits (M: an integer not smaller than 2). The first to M-th semiconductor inspection circuits are configured to perform inspections on the semiconductor device for first to M-th inspection items, respectively. The first to M-th inspection items are different from each other. The semiconductor inspection device also includes a tester for receiving outputs from the first to M-th inspection circuits, respectively, to judge whether the semiconductor device passes or fails for each of the first to M-th inspection items. The tester further judges whether the semiconductor device is good or not based on the judgment results for the first to M-th inspection items.

9 Claims, 10 Drawing Sheets

SEMICONDUCTOR INSPECTION DEVICE CAPABLE OF PERFORMING VARIOUS INSPECTIONS ON A SEMICONDUCTOR DEVICE

FIELD OF THE INVENTION

The present invention relates to a semiconductor inspection device used when a semiconductor device is inspected and in particular, to a semiconductor inspection device including a plurality of inspection circuits, which are different from each other and conducts a plurality of inspections, and an semiconductor inspection method therefor.

DESCRIPTION OF THE RELATED ART

FIG. 9 is an external view showing a conventional semiconductor inspection device.

Referring to FIG. 9, a reference numeral 1 denotes a tester for testing a semiconductor device (hereinafter referred to simply as a tester); a reference numeral 2 a prober for inspecting a semiconductor device (hereinafter referred to simply as a prober); a reference numeral 3 a semiconductor inspection circuit (hereinafter referred to as a DUT board). The DUT board 3 builds therein peripheral circuits for outputting the electric characteristics of the semiconductor device 4 to be inspected (that is, a semiconductor device to be undergone inspection; hereinafter referred to as a DUT), and a conversion circuit for converting the electric characteristics into a measurable signal by a tester 1 for inspecting the semiconductor device and the like by a probe 5. The DUT 4 and the DUT board 3 are electrically connected to each other.

As shown in FIG. 10, the DUT board 3 is mounted with a semiconductor inspection circuit unit (hereinafter referred to as simply an inspection circuit unit) 3a, on which the probe (probe needle) 5 is provided. Then, when the DUT 4 is inspected the probe needle 5 is put into contact with (connected to) the DUT 4 to electrically connect the DUT 4 to the inspection circuit unit 3a. Here, the tester 1 for inspecting the semiconductor device is connected to the inspection circuit 3a via an interface cable 6a.

Next, the operation of the conventional semiconductor inspection device shown in FIG. 9 will be described. When the DUT 4 is inspected, first, referring to FIG. 10 and FIG. 11, an inspection program and the semiconductor inspection circuit unit 3a are designed in accordance with what kind of inspection the DUT 4 conducts. Then, the DUT 4 (for example, wafer) is set on the DUT board 3 and a test (inspection) is started. After the inspection is started, a test start signal is sent to the prober 2 from the tester 1 (step ST1). When the prober 2 receives the test start signal, the prober 2 starts probing (step ST2). When the probing is started, first, the prober 2 controls the DUT board 3 and electrically connects the inspection circuit unit 3a to the DUT 4 by the probe 5. That is, the inspection circuit unit 3a is put into contact with the DUT 4 by the probe 5 (step ST3). When the inspection circuit unit 3a is contacted with the DUT 4, an inspection program (test program) is executed and the tester 1 sets inspection items (I) from 1 to J (J: an integer not smaller than 2) in accordance with the test program (step ST4). That is, the inspection is started after a plurality of inspection items are set (step ST5).

First, the tester 1 inspects the DUT 4 when the inspection item is I=1 and judges the inspection result (step ST6). If the inspection result is "good", the process proceeds to the next inspection item (NEXT J: step ST7) and judges the inspection result in the same way. When the tester 1 ends inspecting the inspection items from 1 to J in this manner, that is, if the tester 1 judges that the DUT 4 is not bad in terms of all the inspection items from 1 to J, the tester 1 judges the DUT 4 to be a good product and sends a PASS signal to the prober 2 (step ST8). Then, the tester 1 ends the inspection and sends an END signal to the prober 2 (step ST9). When the prober 2 receives the END signal, the prober 2 controls the DUT board 3 and ends probing (step ST10).

Otherwise, if the DUT is judged to be "bad", for example, it is judged that the DUT is bad in terms of the inspection item j (j: any one of integers from 1 to J), the tester 1 stops the test at a point of time of the inspection item j (when the DUT is judged to be bad) (step ST11). Then, the tester 1 sends a FAIL signal to the prober 2 (step ST12). This FAIL signal includes the inspection item j at which the DUT is judged to be bad. In response to the FAIL signal, the prober 2 marks the bad DUT 4 to designate a bad chip (step ST13), and further performs a map data processing for the bad DUT 4 on the basis of the FAIL signal (step ST14). After the tester 1 sends the FAIL signal, the tester 1 performs a bad category classification (binning) for the bad DUT 4 (step ST15) in accordance with how many inspection items j are and ends the inspection. As described above, the tester 1 sends the END signal to the prober 2 and the prober 2 ends probing.

The tests are repeatedly performed for the respective DUTs in the manner described above. In this manner, in the semiconductor inspection device shown in FIG. 9, the tester 1 and the prober 2 inspect and judge the DUTs in accordance with the inspection items, and the tester 1 stores the judgment results in the built-in storage circuit, and if the DUT is judged to be bad, the prober 2 marks the bad DUT to discriminate the bad chip.

Alternatively, as shown in FIG. 12, the DUT board 3 may be mounted with a plurality of inspection circuits. In FIG. 12, the first inspection circuit unit 3b and the second inspection circuit unit 3c are mounted on the DUT board 3. The first and the second inspection circuit units 3b and 3c are provided with the probes 5a and 5b, respectively, and the DUT 4a and the DUT 4b are mounted on the first and the second inspection circuit units 3b and 3c, respectively. The DUTs 4a and 4b are put into contact with the probes 5a and 5b, thereby electrically connecting them to the inspection circuit units 3a and 3b. The tester is connected to the first and the second inspection circuits 3b and 3c via interface cables 6b and 6c. The tester shown in FIG. 12 can test a plurality of DUTs at the same time and is referred to as a multiple tests related tester (indicated by a reference numeral 1a in FIG. 12). The first and the second inspection circuit units 3b and 3c, which have the same circuit configuration and are connected to pins of the tester 1a and are different from each other.

The tests (inspections) of the DUTs 4a and 4b when the above multiple tests related tester 1a will be described with reference to FIG. 13.

As described in FIG. 11, after the DUTs 4a and 4b are set on the DUT board 3 the test (inspection) is started. After the inspection is started, the tester 1a sends a test start signal to the prober 2 (step ST11). When the prober 2 receives the test start signal, the prober 2 starts probing (step ST12). When the prober 2 starts probing, first, the prober 2 controls the DUT board 3 to electrically connect the first and the second inspection circuit units 3b and 3c to the DUTs 4a and 4b by the probes 5a and 5, respectively. That is, the first and the second inspection circuit units 3b and 3c are put into electrical contact with the DUTs 4a and 4b by the probes 5a and 5, respectively (step ST13). When the first and second inspection circuit units 3b and 3c are electrically contacted with the DUTs 4a and 4b, an inspection program (test program) is executed and in accordance with the test program, the tester 1a sets the inspection items (I) from 1 to J, that is, sets a plurality of inspection items (step ST14) and starts the inspection (step ST15).

First, the tester 1a inspects the DUTs 4a and 4b in terms of the inspection item I=1 at the same time and judges the inspection results (steps ST16 and ST17). If the judgment reveals the DUT 4a to be "good", the process proceeds to the next inspection item (step ST18) and the tester 1a judges the inspection result in the same way (step St18). Further, as to the DUT 4b, if the judgment reveals the DUT 4b to be "good" as well, the process proceeds to the next inspection item (step ST19) and the tester 1a judges the inspection result. When tester 1a ends the judgments in terms of the inspection items from 1 to J in this manner, that is, if the tester 1a judges that the DUTs 4a and 4b are not bad in terms of all the inspection items, the tester 1a judges the DUTs 4a and 4b to be good products and sends a PASS signal to the prober 2 (step ST20). Then, the tester 1a ends the inspection and sends an END signal to the prober 2 (step ST21). When the prober receives the END signal, the prober 2 controls the DUT board 2 and ends probing (step ST22).

Otherwise, if the tester 1a judges the DUT 4a to be "bad", the tester 1a stops the test at a point of time where it judges that the DUT 4a is bad (at a point of time of the inspection item j) (step ST23), and performs a failure judgment processing (FAIL processing) (step ST24). Similarly, if the tester 1a judges the DUT 4b to be "bad", the tester 1a stops the test at a point of time where it judges that the DUT 4b is bad (step ST25), and performs a FAIL processing. In the FAIL processing, if the DUT 4a is "bad", the first FAIL signal indicating that the DUT 4a is bad is given to the prober 2 and the prober 2 marks the DUT 4a in accordance with the first FAIL signal to discriminate a bad chip (step ST26). Similarly, in the FAIL processing, if the DUT 4b is "bad", the second FAIL signal indicating that the DUT 4b is bad is given to the prober 2 and the prober 2 marks the DUT 4a in accordance with the second FAIL signal to designate a bad chip (step ST27).

As described above, the tester 1a sends the FAIL signal and then performs a failure category classification (binning) for the bad DUT in accordance with how many inspection item j are (step ST28) and the tester 1a ends the inspection. Then, as described above, the tester 1a sends the END signal to the prober 2 and the prober 2 ends probing.

Since the tester 1a inspects the plurality of DUTs at the same time in a manner as described above, the matrix pins of the tester 1a increase in number in proportion to the number of DUTs as compared with the case where only one DUT is inspected, but an inspection processing capacity is improved.

The conventional semiconductor inspection device constructed as described above permits only the same inspection for one or a plurality of DUTs. Therefore, different inspections need different inspection devices, which requires the extremely long time for the inspections.

In other words, as the DUT increases its performance and operating speed in recent years, the semiconductor inspection device itself increases its performance and employs multiple pins, thereby making it possible to inspect the DUT in correspondence with its increased performance. However, such a semiconductor inspection device is very costly. For this reason, as the things stand, the DUT is inspected by the use of the inspection device in accordance with what kind of the inspection device inspection conducts.

However, as the DUT increases its performance and operating speed, the contents of inspection complicates and the inspection items becomes enormous. Accordingly, a plurality of inspection processes must go through to conduct the inspection of one DUT. In other words, it is extremely difficult to inspect all functions of the DUT by one inspection device and thus a plurality of inspection processes are required, which experiences not only a elongated inspection time of the DUT but also an increased cost.

SUMMARY OF THE INVENTION

The present invention has been made to solve the above-mentioned problems. An object of the present invention is to provide a semiconductor inspection device capable of performing a plurality of inspection processes at the same time and a semiconductor inspection method therefor.

Another object of the present invention is to provide a semiconductor inspection device capable of inspecting a semiconductor device in a short time at a low cost and a semiconductor inspection method therefor.

A semiconductor inspection device according to the present invention includes a semiconductor inspection circuit on which a semiconductor device is set in inspecting whether the semiconductor device is good or bad, and a tester for judging whether the semiconductor device is good or bad in accordance with the inspection output from the semiconductor inspection circuit, the semiconductor inspection circuit including semiconductor inspection circuit units from a first to an M-th (M: an integer not smaller than 2) which each inspect the semiconductor device in terms of the inspection items from a first to an M-th, which are different from each other, and wherein the tester judges the semiconductor device in terms of the inspection items from the first to the M-th in accordance with inspection outputs outputted from the semiconductor inspection circuit units from the first to the M-th to take them as judgment results from a first to an M-th.

As described above, according to the present invention, since the semiconductor inspection device includes the plurality of semiconductor inspection circuit units for each inspecting the inspection items in the semiconductor inspection circuit, which are different from each other and judges the semiconductor device in terms of the respective inspection items in accordance with the inspection outputs from the respective semiconductor inspection circuit units to produce a judgment result, it is possible to inspect the inspection items different from each other by one semiconductor inspection device. As a result, a plurality of inspection processes can substantially be assembled in to one inspection process. Further, since the plurality of inspection processes is substantially assembled into one inspection process, it is possible to inspect the semiconductor in a short time. Moreover, an increase in cost can be prevented because a specific semiconductor inspection device is unnecessary, that is, the inspection of the semiconductor device is performed at a low cost.

A semiconductor inspection device according to the present invention includes a semiconductor inspection circuit on which a semiconductor device is set in inspecting whether the semiconductor device is good or bad, and semiconductor inspection circuit units from the first to the M-th provided in the semiconductor inspection circuit and each inspect the semiconductor device in terms of inspection items from the first to the M-th (M: an integer not smaller than 2), which are different from each other, the method including the steps of: setting the semiconductor device on the m-th (m: an integer from 1 to M) semiconductor inspection circuit unit and judging whether the semiconductor device is good or bad in terms of the m-th inspection item to obtain the m-th judgment result; latching the m-th judgment result; and generating a good/bad result indicating whether the semiconductor device is good or bad on the basis of judgment results from the first to the M-th in accordance with a timing where the inspection in terms of the M-th inspection item is ended.

DESCRIPTION OF THE PREFERRED EMBODIMENTS

The preferred embodiments of the present invention will be hereinafter described in detail with reference to the attached drawings.

First Embodiment

Figure 1:
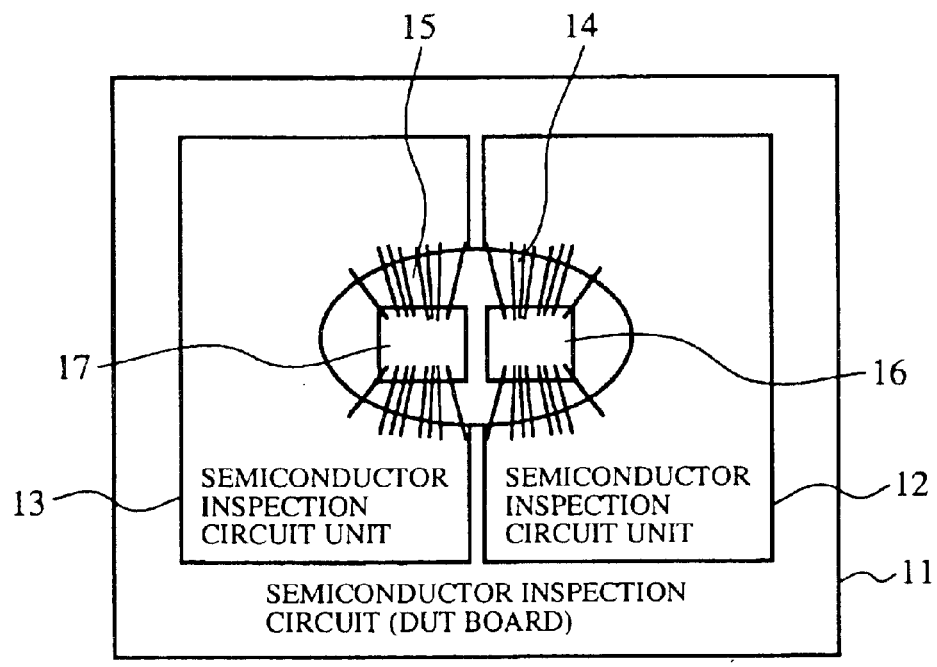
FIG. 1 is an external view showing a part of a semiconductor inspection device according to a first embodiment of the present invention.

FIG. 1 is an external view showing a part of a semiconductor inspection device according to the first embodiment of the present invention.

Figure 9:
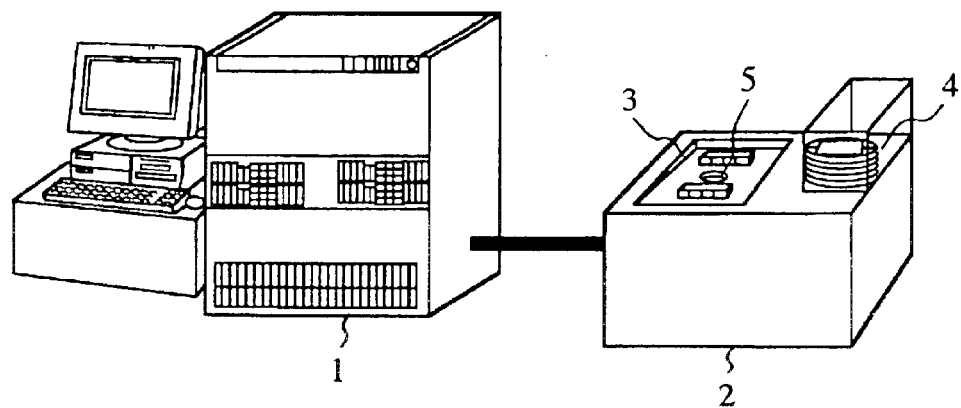
FIG. 9 is an external view showing a conventional semiconductor inspection device.
Figure 10:
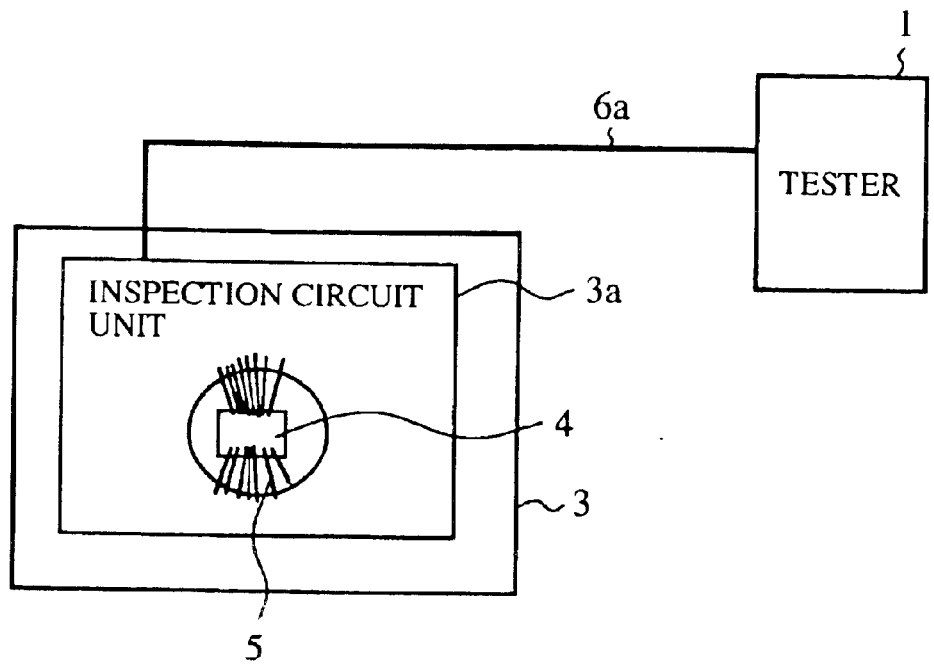
FIG. 10 is a block diagram showing an example of a semiconductor inspection circuit of a semiconductor inspection device.
Figure 12:
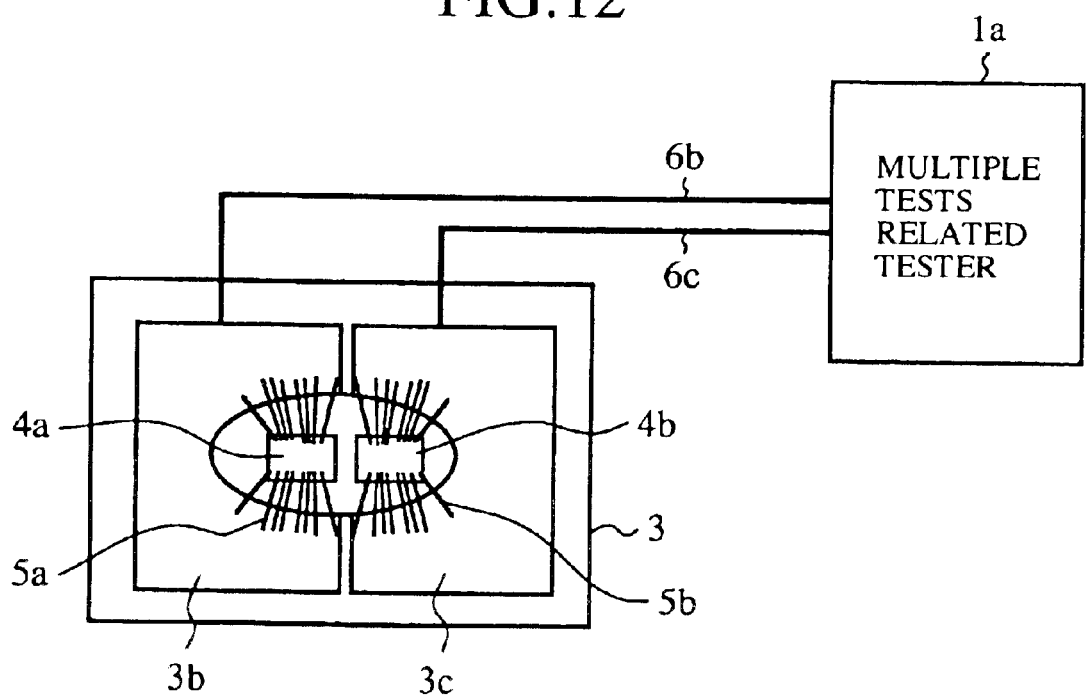
FIG. 12 is a block diagram showing another example of a conventional semiconductor inspection circuit of a semiconductor inspection device.
Figure 11:
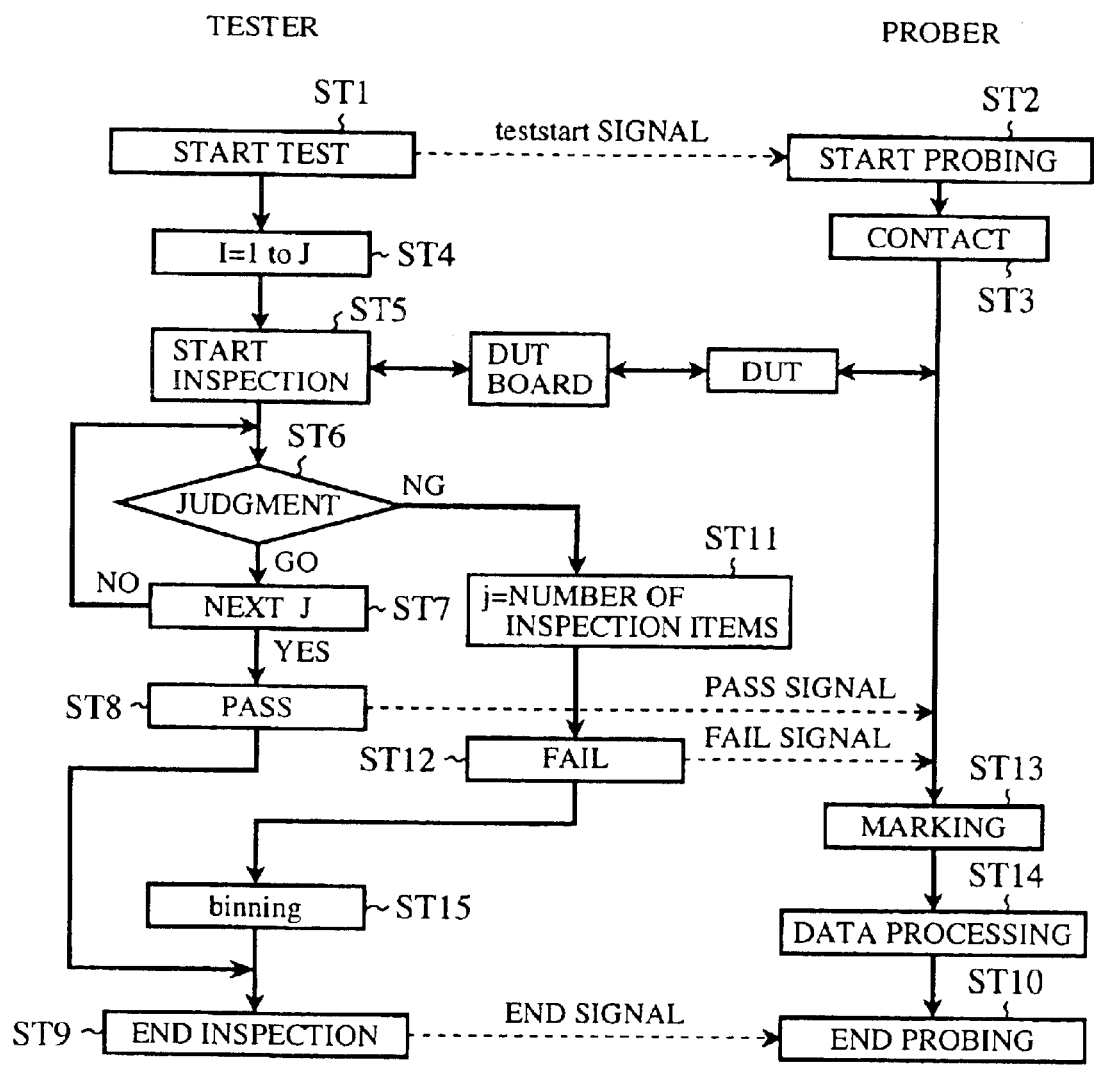
FIG. 11 is a flow chart explaining an semiconductor inspection using the semiconductor inspection circuit shown in FIG. 10.
Figure 13:
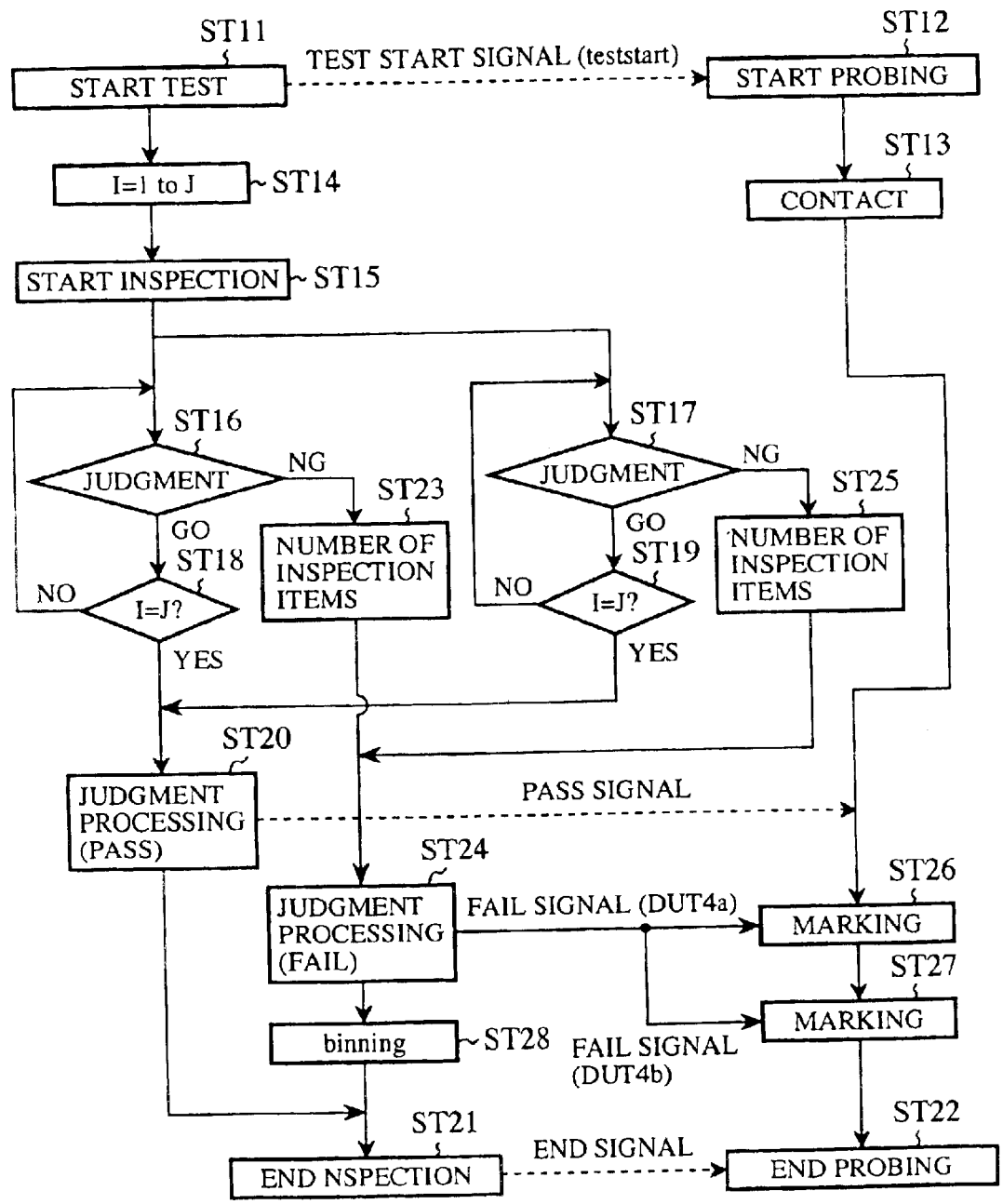
FIG. 13 is a flowchart explaining the semiconductor inspection using the conventional semiconductor inspection circuit shown in FIG. 12.

Referring to FIG. 1, a reference numeral 11 denotes a semiconductor inspection circuit (DUT board) and a plurality of semiconductor inspection circuit units (hereinafter referred to as inspection circuit units), which are different from each other, are mounted on the DUT board (in FIG. 1, the first inspection circuit unit 12 and the second inspection circuit unit 13 are mounted). That is, inspection items to be inspected are different between the first inspection circuit unit 12 and the second inspection circuit unit 13. The first inspection circuit unit 12 and the second inspection circuit unit 13 are provided with probes 14 and 15, respectively and semiconductor devices (DUTs) are mounted on the first inspection circuit unit 12 and the second inspection circuit unit 13 and are connected to the probes 14 and 15, respectively. In FIG. 1, the DUTs mounted on the first inspection circuit unit 12 and the second inspection circuit unit 13 are denoted by reference numerals 16 and 17, respectively. Here, a DUT board 11 (not shown) is connected to a tester (for example, a tester shown in FIG. 9) and a prober and the DUTs are inspected (tested), as will be described later.

Next, the operation of the semiconductor inspection circuit of the first embodiment will be described. Now, assume that the first inspection circuit unit 12 tests the first item (including a plurality of inspection items) and the second inspection circuit unit 13 the second item. A DUT 16 and a DUT 17 are set on the first and the second inspection circuit units 12 and 13, respectively, and then the tests (inspections) starts. When the test starts, a tester sends a test start signal to a prober (step ST31). When the prober receives the test start signal, the prober starts probing (step ST32). When the prober starts probing, first, the prober controls the DUT board 11 and electrically connects the first and second inspection circuit units 12 and 13 to the DUTs 16 and 17 by the probes 14 and 15 to bring them into contact, respectively (step ST33). When they are contacted, the tester starts inspection (step ST34) and sets the inspection item (I) from 1 to J (J is an integer not smaller than 2) (step ST35) and then starts inspecting the semiconductor device for the first inspection item A (step ST36). This first inspection item A corresponds to the first inspection step and is in charge of the first inspection circuit 12.

When the inspection in terms of the first inspection item A is started, the tester inspects the DUT 16 in terms of the inspection item I=1 and judges the inspection result (step ST37). If the judgment result is "good", the process proceeds to the inspection in terms of the next inspection item (step ST38) and judges the inspection result in the same way. When inspections in terms of the inspection items from 1 to J are ended in this manner, in other words, if the DUT 16 is not judged to be bad in terms of all the inspection items from 1 to J, the tester judges the DUT 16 to be a good product (PASS: step ST39) and stores the judgment result (PASS in this case) in a storage circuit (not shown) built in the DUT 16 (step ST40).

Otherwise, if the tester judges that the DUT 16 is bad in terms of the inspection item j (j is any one of integers from 1 to j) at the step ST37, the tester recognizes how many inspection items j are (step ST41) and performs a failure processing (FAIL processing) (step ST42). If the tester judges the DUT 16 to be bad, the tester takes the bad DUT 16 (including the number of the inspection item j) as a result of the judgement and stores it in the storage circuit built in the DUT 16.

The tester sets the inspection item (K) from 1 to L (L is an integer not smaller than 2) while storing the judgment results in the storage circuit (step ST43) in a manner as described above, and then starts an inspection for the second inspection item B for the next DUT 17 (step ST44). This inspection item B corresponds to the second inspection step and is in charge of the second inspection circuit unit 13.

When the inspection for the DUT 17 in terms of the second inspection item B is started, the tester inspects the DUT 17 in terms of the inspection item K=1 and judges the inspection result (step ST45). If the judgment result is "good", the process proceeds to the inspection in terms of the next inspection item (step ST46) and judges the inspection results in the same way. When inspections in terms of the inspection items to L are ended in this manner, in other words, if the DUT 17 is not judged to be "bad" in terms of all the inspection items from 1 to L, the tester judges the DUT 17 to be a good product (PASS: step ST47) and stores the judgement result (PASS in this case) in a storage circuit (not shown) built in the DUT 17 (step ST48).

Otherwise, if the tester judges the DUT 17 to be "bad" in terms of the inspection item 1 (1 is any one of integers from 1 to L) at the step ST45, the tester recognizes how many inspection items 1 are (step ST49) and performs a FAIL processing and stops the test at a point of time where the DUT 17 is judged to be bad (step ST50). Thereafter, the tester takes the bad DUT 17 (including the number of the inspection item 1) as a judgement result and stores it in the storage circuit built in the DUT 17.

After the tester inspects the DUTs 16 and 17 in terms of the first and the second inspection items A and B in a manner as described above, the prober sets the DUT 17 on the first inspection circuit unit 12 and the DUT 16 on the second inspection circuit unit 13, and then the tester inspects the DUT 16 and the DUT 17 in terms of the first and the second inspection items A and B in the same way as described above.

After the tester inspects as described above, the tester judges whether each of the DUTs 16 and 17 is a good product or not on the basis of the judgment results stored in the respective DUTs. At this time, depending on the judgment results, in the case where the DUT is a good product, the tester sends a PASS signal to the prober. Otherwise, the tester sends a FAIL signal to the prober. In response to the FAIL signal, the prober marks the corresponding DUT to indicate that the DUT is a bad chip (step ST51). Further, the tester performs a failure category classification (binning) for the bad DUT in accordance with how many inspection items are (step ST52) and ends the inspection (step ST53). Then, the tester sends an END signal to the prober and the prober ends probing (step ST54).

Incidentally, when inspecting DUTs from the first to the N-th (N: an integer of 2 or more), first, the first DUT is set on the first inspection circuit unit 12 and inspects it in terms of first inspection item A. Then, the prober sets the first DUT on the second inspection circuit unit 13 and the second DUT on the first inspection circuit unit 12 to inspect the first DUT in terms of the second inspection item B and the second DUT in terms of the first inspection item A. When the inspections are ended, next, the prober sets the second DUT on the second inspection circuit unit 13 and the third DUT on the first inspection circuit unit 12 to inspect the second DUT in terms of the second inspection item B and the third DUT in terms of the first inspection item A. In other words, consecutive settings of the (n−1)th DUT and the n-th DUT (n is an integer from 2 to N) on the first and the second inspection circuit units 12 and 13 for inspections enables successive inspections in terms of the first inspection items A and the second inspection B, which are different from each other.

In FIG. 1 the description has been made by giving the case as an example where the DUT board 11 is provided with the first and the second inspection circuit units 12 and 13 and the inspections are conducted in terms of the first and the second inspection items A and B, which are different from each other, by the use of the first and the second inspection circuit units 12 and 13. Alternatively, in the case where the inspections are conducted in terms of the inspection items from the first to the M-th (M is an integer not smaller than 2), which are different from each other, by the use of one DUT board, it is recommended that the DUT board be provided with the inspection circuit units from the first to the M-th and that the inspections be conducted in terms of the inspection items from the first to the M-th by the use of the inspection circuit units from the first to the M-th, as described with reference to FIG. 2.

Figure 2:
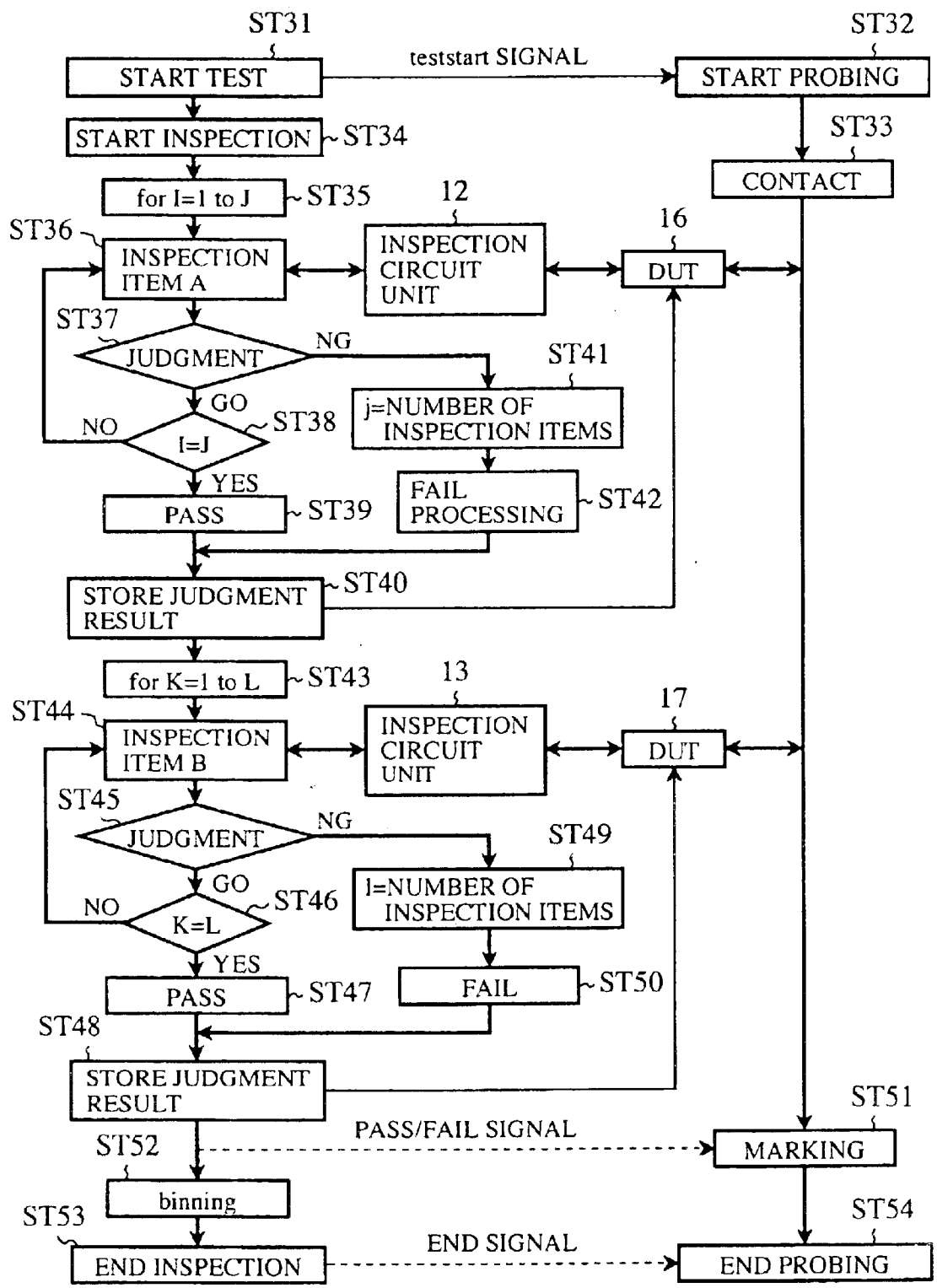
FIG. 2 is a flowchart explaining the operation of the semiconductor inspection device shown in FIG. 1.

In the semiconductor inspection device depicted in FIG. 1 and FIG. 2, for example, where the first inspection item A concerns an DC (direct current) inspection and the second inspection item B an AC (alternating current) inspection, a switch for switching the inspection items, such as a relay, can be dispensed with as compared with the case where one inspection circuit is shared by the DC inspection and the AC inspection. Further, since respective items are inspected by the corresponding dedicated inspection circuit unit, for example, a circuit configuration specifically designed to inspect high frequency characteristics can be easily realized. This improves the inspection accuracy in inspecting the AC characteristics of the DUT.

As described above, according to the first embodiment of present embodiment, it is possible to inspect the semiconductor device in terms of the inspection items, which are different form each other, by the use of one semiconductor inspection device. As a result, a plurality of inspection processes can substantially be assembled into one process, thus inspecting the semiconductor device in a short time. Further, since any specific semiconductor inspection device (for example, multiple inspections related tester), is not required, an increase in cost can be prevented. That is, it is possible to inspect the semiconductor device at a low cost.

Second Embodiment

Figure 3:
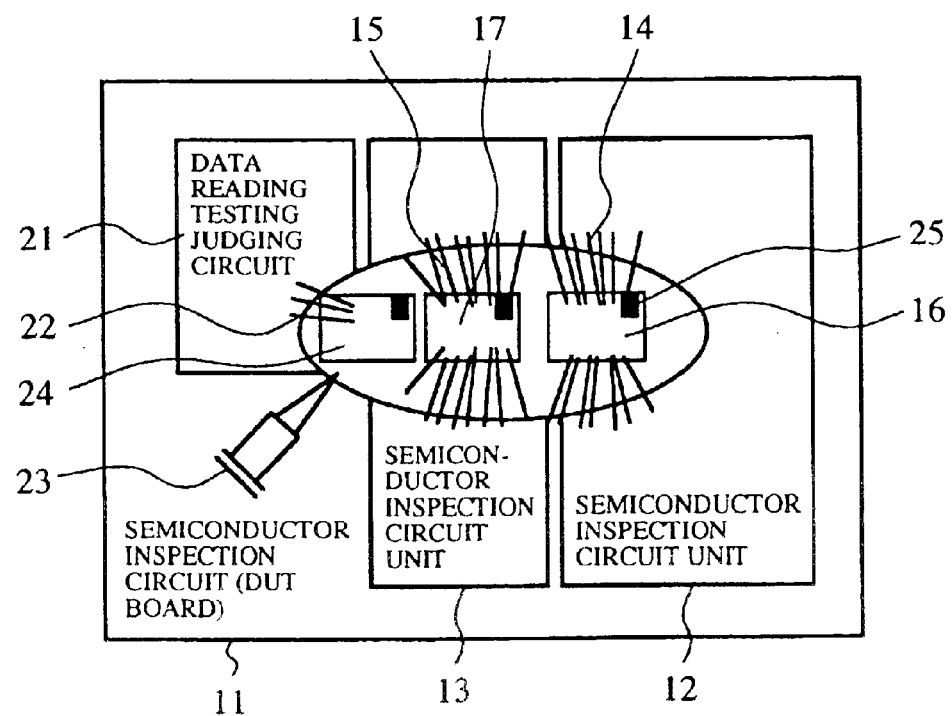
FIG. 3 is a block diagram showing a part of a semiconductor inspection device according to a second embodiment of the present invention.

In FIG. 3, like reference numerals as those shown in FIG. 1 indicate the same components and the description thereof is omitted for brevity's sake. In FIG. 3, the DUT board 11 includes the first and the second inspection circuit units 12 and 13 as well as a data reading testing judging circuit 21. The data reading testing judging circuit 21 is connected to the DUT by a probe 22 and further, the DUT board 11 is provided with an inker 23 (the data reading testing judging circuit and the inker function as a test judging unit). In FIG. 3, the DUTs mounted on the first and the second inspection circuit units 12 and 13 are denoted by reference numerals 16 and 17, respectively, and the DUT connected to the data reading testing judging circuit 21 by the probe 22 is denoted by a reference numeral 24. Here, each of the respective DUTs 16, 17 and 24 built therein a storage circuit (denoted by a reference numeral 25 in FIG. 3). Here, the DUT board 11 (not shown) is connected to a tester (for example, a tester shown in FIG. 9) and a prober and the DUTs undergo inspections (tests), as will be described later.

Next, the operation of the semiconductor inspection circuit of the second embodiment will be described.

Figure 4:
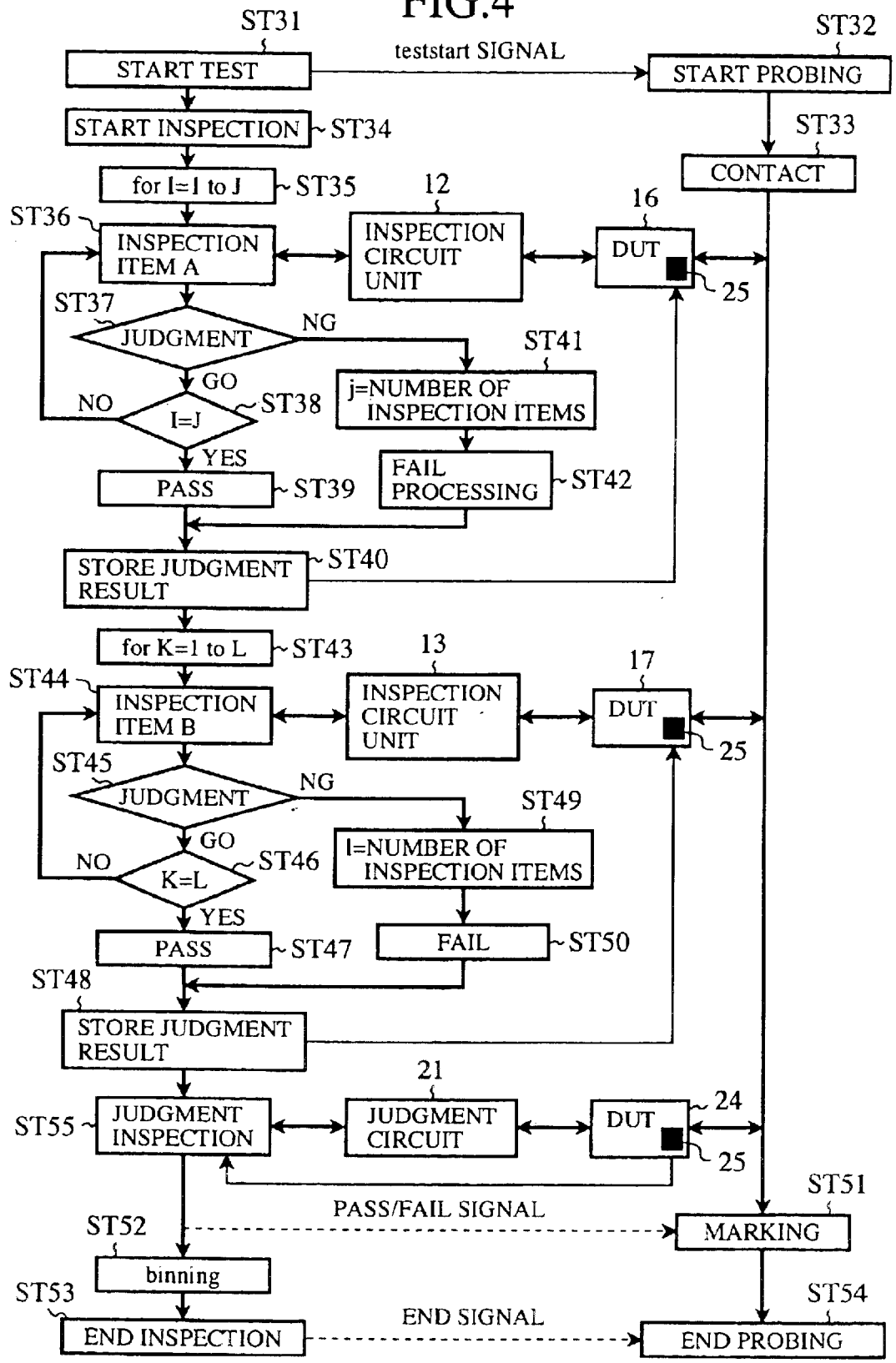
FIG. 4 is a flowchart explaining the operation of the semiconductor inspection device shown in FIG. 3.

In FIG. 4, like reference numerals as those in FIG. 2 indicate like steps and the description thereof is omitted for brevity's sake. Now, assume that the first and the second inspection circuit units 12 and 13 subsequently inspect the DUTs in terms of the first and second inspection items A and B, as shown in FIG. 2, and that the DUT whose inspections in terms of the first and the second inspection items A and B are ended (DUT24 in FIG. 3) is contacted with the data reading testing judging circuit 21 by the probe 22.

The DUT 14 is ended the inspections in terms of the first and the second inspection items A and B and the judgment results thereof are stored in the storage circuit 25 built in the DUT24. The data reading testing judging circuit 21 reads out the judgment result from the storage circuit 25 and conducts a judgment inspection whether the DUT24 is a good product or not (step ST55). The data reading testing judging circuit 21 sends the judgment result of the inspection to the tester. At this time, if the DUT24 is a bad product, the inker 23 marks the DUT24 with a bad mark.

If the judgment result of the inspection indicates a bad product, the tester performs a bad category classification (binning) for the bad DUT in accordance with how many inspection items are and ends the inspection. The tester sends an END signal to the prober and the prober ends probing.

Incidentally, where the DUT encounters a difficulty in including therein the storage circuit, for example, it is recommended that an element such as a transistor or the like be built previously in the DUT and that the transistor be used as a fuse element. That is, a large current is passed through the transistor to break the transistor to indicate whether the DUT is a good product or not and stores it.

As described above, according to the second present embodiment, the semiconductor inspection device includes the inspection circuit units for the respective inspection items in the semiconductor inspection circuit, stores the judgment results of the inspection items in the respective DUTs, includes the data reading testing judging circuit in the semiconductor inspection circuit, and judges whether the DUT is a good product or not by the data reading testing judging circuit immediately at the next step where the inspection device inspects the DUT, so that the semiconductor inspection device can judge whether the DUT is a good product or not immediately after it inspects the DUT in terms of the plurality of inspection items.

Third Embodiment

Figure 5:
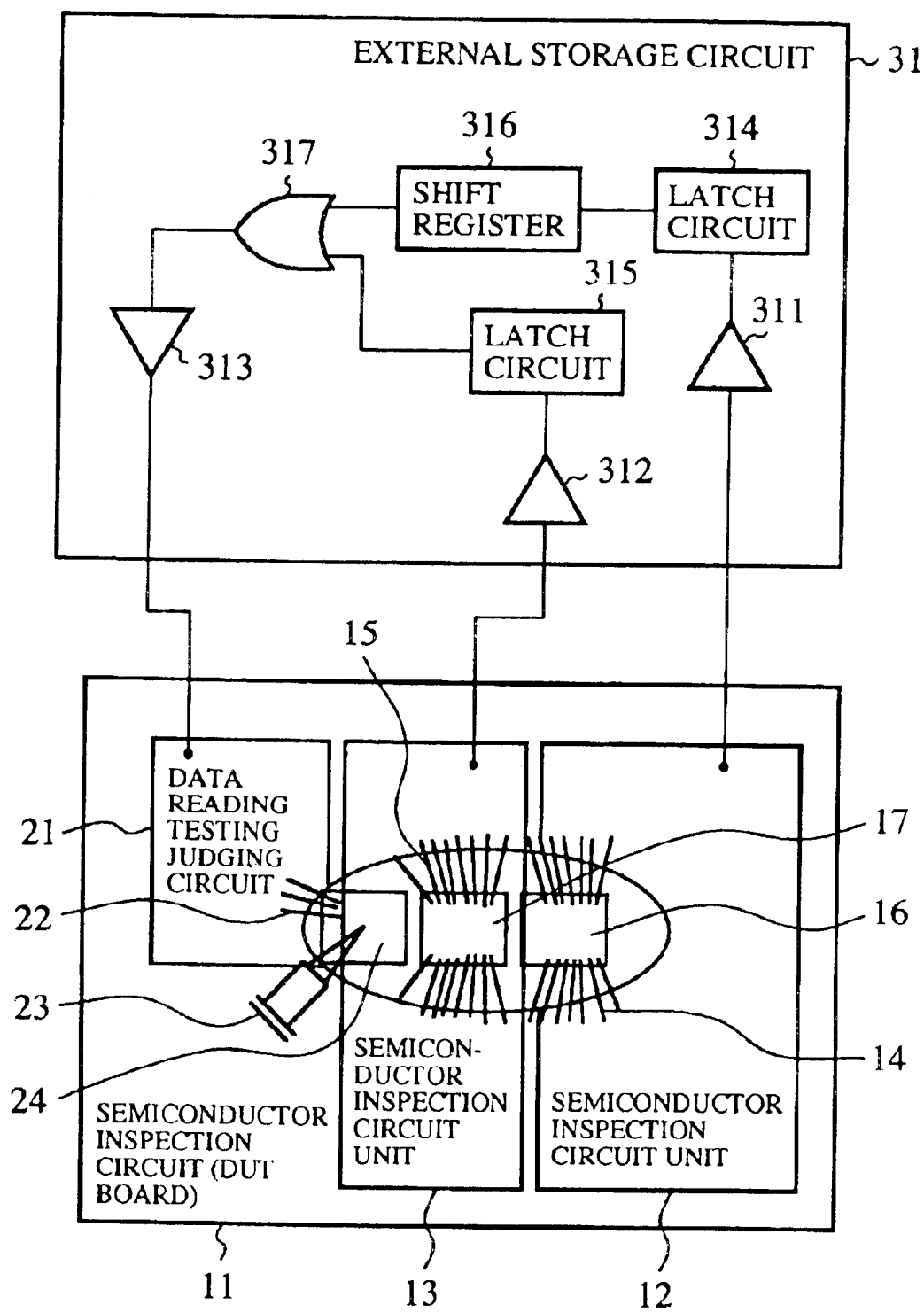
FIG. 5 is a block and circuit diagrams showing a part of a semiconductor inspection device according to a second embodiment of the present invention.

In FIG. 5, like reference numerals as those shown in FIG. 3 indicate like components and the description thereof is omitted for brevity's sake. In FIG. 5, the DUT board 11 includes an external storage circuit 31. The external storage circuit (storage unit) 31 includes buffers 311 to 313, latch circuits 314 and 315, a shift register 316, and an OR gate 317, and stores the judgment result of inspection in terms of the inspection item conducted by the first and the second inspection circuit units 12 and 13 and sends the judgment result to the data reading testing judging circuit 21 as will be described later. Here, in FIG. 5, assume that the storage circuit is not built in the DUTs 16 and 17 and 24. Further, the DUT board 11 (not shown) is connected to the tester (for example, the tester shown in FIG. 9) and the prober and the DUT is inspected (tested) as will be described later.

Next, the operation of the semiconductor inspection device of the second embodiment will be described.

Figure 6:
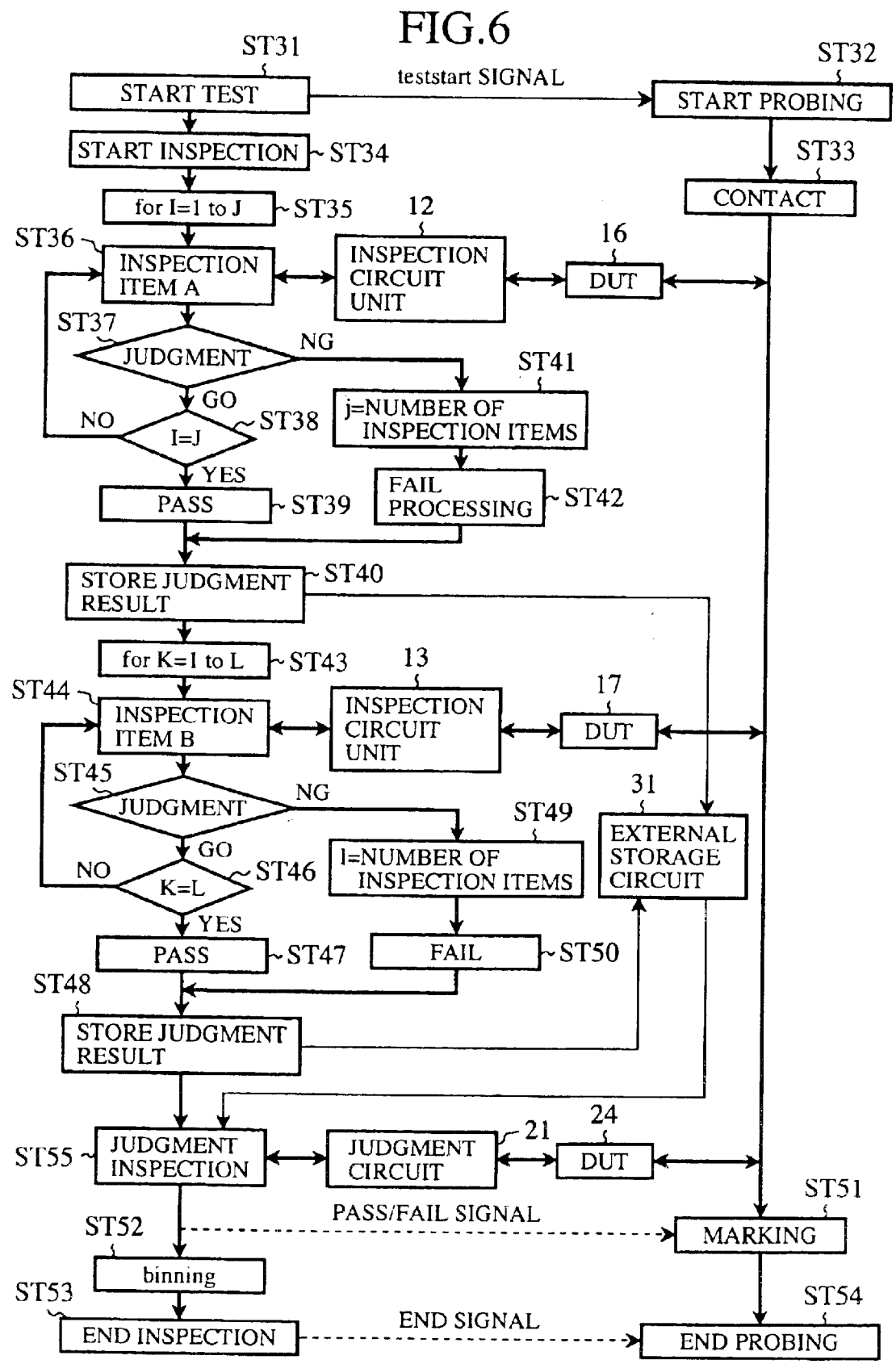
FIG. 6 is a flowchart explaining the operation of the semiconductor inspection device shown in FIG. 5.

In FIG. 6, like reference numerals as those in FIG. 2 and FIG. 4 indicate like steps and the description thereof is omitted for brevity's sake. Here, the first and the second inspection circuit units 12 and 13 serially inspects the DUTs in terms of the first and the second inspection items A and B, as described in FIG. 2 and FIG. 4, and the DUT whose inspections in terms of the first and the second inspection items A and B are ended is contacted with the data reading testing judging circuit 21 by the probe 22. In the step ST42 shown in FIG. 6 the inspection result (judgment result) of the first inspection item A is stored in the external storage circuit 31 as will be described later. Similarly, in the step ST48, the judgment result of the second inspection item B is stored in the external storage circuit 31. Further, in the step ST55, the data reading testing judging circuit 21 judges whether the DUT is a good product or a bad product in accordance with the judgment result read out of the external storage circuit 31.

Suppose that the DUT 16 is serially inspected in terms of the first inspection item A and the second inspection item B, referring to also FIG. 5, the judgment result (the first judgment result) of the inspection for the DUT 16 in terms of the first inspection item A conducted by the first inspection circuit unit 12 is latched by the latch circuit 314 via the buffer 311. Next, the DUT 16 is set on the second inspection circuit unit 13 and the judgment result (second judgment result) of the inspection for the DUT 16 in terms of the second inspection item B is latched by the latch circuit 315 via the buffer 312. At this time, the judgment result latched by the latch circuit 312 is outputted to the shift register 316. Then, at the stage where the DUT_16 is connected to the data reading testing judging circuit, the first and the second judgment results are outputted to the OR gate 317 from the shift register 316 and the latch circuit 315, respectively, and are ORed there. The OR gate outputs an OR signal and the OR signal is given to the data reading testing judging circuit 21. Then, the data reading testing judging circuit 21 judges whether the DUT 16 is good or bad in accordance with the OR signal. Here, the latch circuits 314 and 315 and the shift register 316 function as the latch means.

Figure 7:
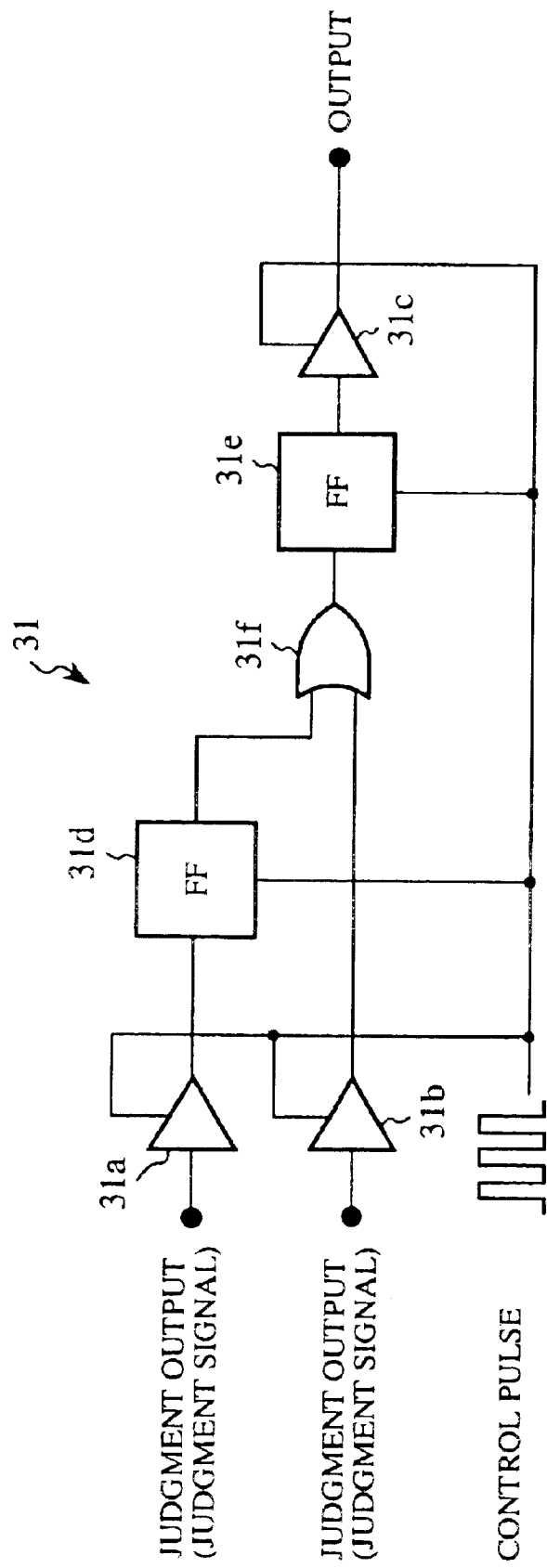
FIG. 7 is a circuit diagram showing an example of the external storage circuit shown in FIG. 5.

Alternatively, the external storage circuit 31 maybe constituted as shown in FIG. 7. The external storage circuit 31 includes buffers 31a to 31c, flip-flops (FFs) 31d and 31e and an OR gate 31f, and the buffers 31a to 31c and the flip-flops 31d and 31e are controlled by a control pulse and store the judgment results of the inspections in terms of the inspection items conducted by the first and the second inspection circuit units 12 and 13 and give the judgment results to the data reading testing judging circuit 21 as will be described later. Here, the flip-flop 31d functions as the first latch unit and the flip-flop 31e functions as the second latch unit.

Figure 8:
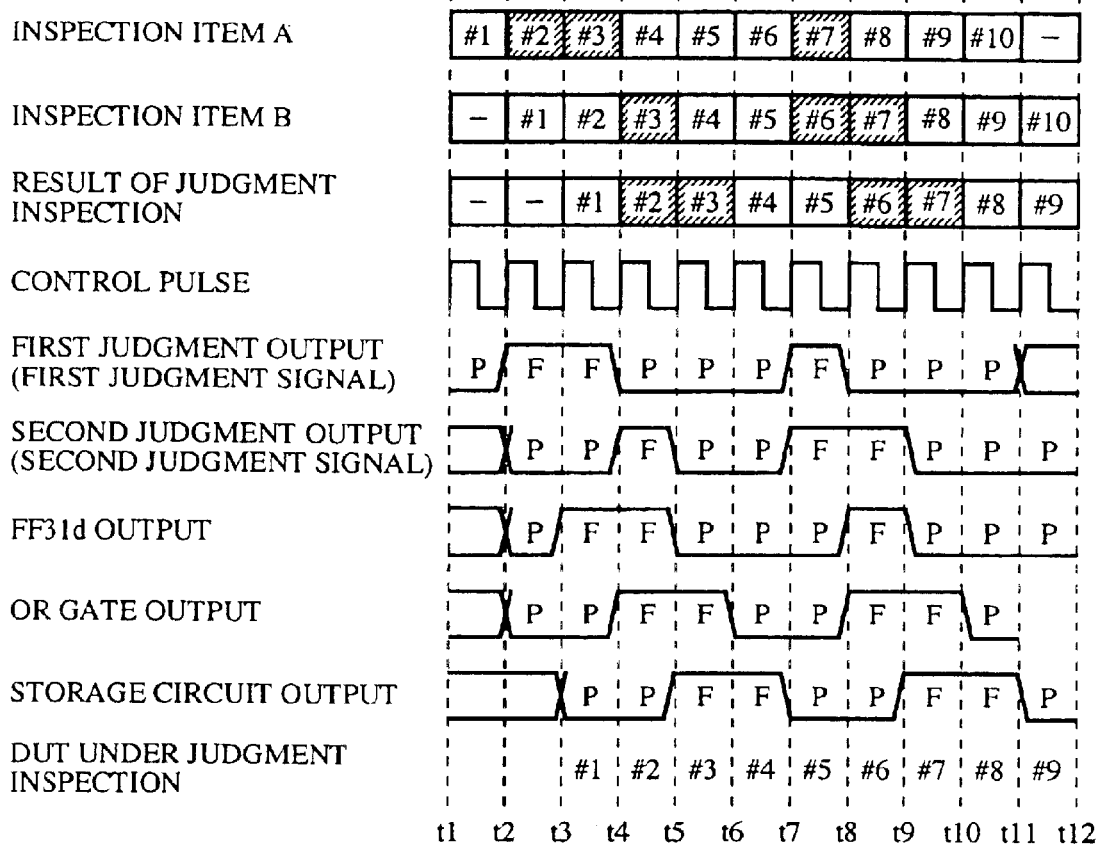
FIG. 8 is a timing chart explaining the operation of the external storage circuit shown in FIG. 7.

Assume that the DUTs to be inspected are DUT #1 to DUT #10, first, referring now to FIG. 6, FIG. 7 and FIG. 8, the DUT #1 is set on the first inspection circuit unit 12 at a time t1 and an inspection in terms of the first inspection item A is conducted. At this time, DUT is not set on the second inspection circuit unit 13 and the data reading testing judging circuit 21 is not connected to the DUT, either. Every time the DUT #1 is inspected in terms of the respective inspection items (from 1 to J) of the first inspection item A, the first inspection circuit unit 12 outputs a judgment signal (as described in FIG. 2 and FIG. 4, if the judgment result of the inspection item j is FAIL, the inspection in terms of the inspection item after j is not conducted). Anyway, if there is no FAIL in the judgment results while inspecting the first inspection item A, the judgment signals indicate PASS during the inspections in terms of the first inspection item A, and otherwise if there is a FAIL even once, the judgment signal indicates the FAIL. In FIG. 8, the PASS is represented by P (low level) and the FAIL by F (high level).

In FIG. 8, the first inspection circuit unit 12 judges the DUT #1 to be a good product (PASS) at the times t1 and t2 and outputs the first judgment output (the first judgment output is hereinafter referred to as the first DUT #1 judgment output) and the first DUT #1 judgment output is given to the flip-flop 31d via the buffer 31a.

At the time t2, the DUT #2 is set on the first inspection circuit unit 12 and the DUT #1 is set on the second inspection circuit unit 13. Then, the first inspection circuit unit 12 inspects the DUT #2 in terms of the first inspection item A and the second inspection circuit unit 13 inspects the DUT #1 in terms of the second inspection item B. At this time, the DUT is not connected to the data reading testing judging circuit 21.

At the times t2 and t3, the first inspection circuit unit 12 judges the DUT #2 to be a bad product (FAIL) and outputs the first judgment output (the first judgment output is hereinafter referred to as the first DUT #2 judgment output) and the first DUT #2 judgment output is given to the flip-flop 31d via the buffer 31a.

At the times t2 and t3, the second inspection circuit unit 13 judges the DUT #1 to be a good product (PASS) and outputs the second judgment output (the second judgment output is hereinafter referred to as the second DUT #1 judgment output) and the second DUT #1 judgment output is given to the OR gate 31f via the buffer 31b. At this time, the first DUT #1 judgment output is outputted from the flip-flop 31d and is given to the OR gate 31f. In FIG. 8, both the first DUT #1 judgment output and the second DUT #1 judgment output are P (low level), so that a low level is outputted as an OR output signal from the OR gate 31f. Then, the OR output signal is given to the flip-flop 31e.

At a time t3, the DUT #3 is set on the first inspection circuit unit 12 and the DUT #2 on the second inspection circuit unit 13. Then, the first inspection circuit unit 12 inspects the DUT #3 in terms of the first inspection item A and the second inspection circuit unit 13 inspects the DUT #2 in terms of the second inspection item B. At this time, the DUT #1 is connected to the data reading testing judging circuit 21.

At the times t3 and t4, the first inspection circuit unit 12 judges the DUT #3 to be a bad product (FAIL) and outputs the first judgment output (the first judgment output is hereinafter referred to as the first DUT #3 judgment output) and the first DUT #3 judgment output is given to the flip-flop 31d via the buffer 31a. The second inspection circuit unit 13 judges the DUT #2 to be a good product (PASS) and outputs the second judgment output (the second judgment output is hereinafter referred to as the second DUT #2 judgment output) and the second DUT #2 judgment output is given to the OR gate 31f via the buffer 31b. At this time, the first DUT #2 judgment output is outputted from the flip-flop 31d and is given to the OR gate 31f. In FIG. 8, the first DUT #2 judgment output is F (high level), so that a high level is outputted as an OR output signal from the OR gate 31f. Then, the OR output signal is given to the flip-flop 31e.

At the times t3 and t4, the flip-flop 31e outputs an output indicative of the low level as a judgment output and the judgment output is given as a storage circuit output to the data reading testing judging circuit 2l. The data reading testing judging circuit 21 judges whether the DUT (here, the DUT #1) is a good product or not. Here, since the judgment output is the low level, the data reading testing judging circuit 21 judges the DUT #1 to be a good product. In other words, in the step ST55 shown in FIG. 6, the data reading testing judging circuit 21 judges the DUT #1 as if it read judgment result (judgment output) of the DUT #1 from the external storage circuit 31 and performed the judgment inspection of the DUT #1.

Then, as described in FIG. 4, the data reading testing judging circuit 21 sends the judgment result to the tester. If the judgment result indicates a good product, the tester ends the inspection. Then, the tester sends an END signal to the prober and the prober ends probing.

At a time t4, the DUT #4 is set on the first inspection circuit unit 12 and the DUT #3 on the second inspection circuit unit 13. Then, the first inspection circuit unit 12 inspects the DUT #4 in terms of the first inspection item A and the second inspection circuit unit 13 inspects the DUT #3 in terms of the second inspection item B. At this time, the DUT #2 is connected to the data reading testing judging circuit 21.

At the times t4 and t5, the first inspection circuit unit 12 judges the DUT #4 to be a good product (PASS) and outputs the first judgment output (the first judgment output is hereinafter referred to as the first DUT #4 judgment output) and the first DUT #4 judgment output is given to the flip-flop 31d via the buffer 31a. The second inspection circuit unit 13 judges the DUT #3 to be a bad product (FAIL) and outputs the second judgment output (the second judgment output is hereinafter referred to as the second DUT #3 judgment output) and the second DUT #3 judgment output is given to the OR gate 31f via the buffer 31b. At this time, the first DUT #3 judgment output is outputted from the flip-flop 31d and is given to the OR gate 31f. In FIG. 8, both the first DUT #3 judgment output and the second DUT #3 judgment output are F (high level), so that the high level is outputted as an OR output signal from the OR gate 31f. Then, the OR output signal is given to the flip-flop 31e.

At the times t4 and t5, the flip-flop 31e outputs an output indicating the high level as a judgment output and the judgment output is given to the data reading testing judging circuit 21. The data reading testing judging circuit 21 judges from the judgment output whether the DUT (here, the DUT #2) is good or bad. Here, since the judgment output is the high level, the data reading testing judging circuit 21 judges the DUT #2 to be a bad product. Thereafter, the data reading testing judging circuit 21 sends the judgement result of the inspection to the tester. At this time, if the DUT #2 is a bad product, the inker 23 marks the DUT with a bad mark. If the judgment result of the inspection indicates a bad product, the tester conducts the bad category classification (binning) for the bad DUT in accordance with how many inspection items are and ends the inspection. Then, the tester sends an END signal to the prober and the prober ends probing. The DUT #3 to the DUT_#10 are serially inspected and judged in the same way (in FIG. 8, the DUT #2, DUT #3, DUT #6 and DUT #7 indicated by hatching is bad products).

As can be easily understood from FIG. 8, where the DUT #1 to DUT #10 are subsequently inspected and judged, in inspecting the DUT #3 by the first inspection circuit unit 12 and the DUT #2 by the second inspection circuit unit 13, the judgment output relating to the DUT #1 is given to the data reading testing judging circuit 21 from the external storage circuit 31 and the data reading testing judging circuit 21 performs the judgment inspection for DUT #1. That is, where the N DUTs (here, N is an integer not smaller than 3) are inspected, in inspecting the N-th DUT by the first inspection circuit unit 12 and the (N−1)th DUT by the second inspection circuit unit 13, the judgment output relating to the (N−2)th DUT is given to the data reading testing judging circuit 21 from the external storage circuit 31 and the data reading testing judging circuit 21 performs the judgment inspection of the (N−2)th DUT. In other words, while the judgment results of the respective DUTs are stored in the external storage circuit with timings shifted, the judgment inspections for the respective DUTs are performed.

Incidentally, when the semiconductor inspection circuit includes the inspection circuit units from the first to the M-th, it is recommended that it includes the input buffers from the first to, the M-th and that the (M−1)th flip-flop be connected to the first input buffer, that is, the (M−m)th flip-flop be connected to the m-th input buffer (m is an integer of from 1 to M).

As described above, according to the third embodiment of the present embodiment, the semiconductor inspection device includes the inspection circuit units for the respective inspection items in the semiconductor inspection circuit, stores the judgment results of the respective DUTs in the external storage circuit with timings shifted, and while inspecting the DUTs, reads the judgment results from the external storage circuit and judges whether the DUT is a good product or not. Thus, the semiconductor inspection device can judge whether the DUT is a good product or not immediately after it inspects the DUT in terms of the plurality of inspection items without providing the respective DUTs with the storage circuits.

What is claimed is:

1. A semiconductor inspection device for inspecting a semiconductor device to judge whether the semiconductor device is good or bad, comprising:
   a semiconductor inspection unit including first to M-th semiconductor inspection circuits (M: an integer not smaller than 2) configured to perform inspections on the semiconductor device for first to M-th inspection items, respectively, the first to M-th inspection items being different from each other; and
   a tester for receiving outputs from the first to M-th inspection circuits, respectively, to judge whether the semiconductor device passes or fails for each of the first to M-th inspection items, and for judging whether the semiconductor device is good or not based on judgment results for the respective first to M-th inspection items.

2. The semiconductor inspection device according to claim 1, wherein
   the semiconductor inspection unit includes a storage unit for storing the judgment results made by the tester for the respective first to M-th inspection items, and
   the tester judges whether the semiconductor device is good or not based on the judgment results stored in the storage unit.

3. The semiconductor inspection device according to claim 1, wherein
   each of the first to M-th inspection items includes a plurality of detailed inspection items, and
   when the tester judges that the semiconductor device fails for any of the plurality of detailed inspection items in one of the first to M-th inspection items, the tester determines that the semiconductor device fails for the one of the first to M-th inspection items.

4. A semiconductor inspection device for inspecting a semiconductor device to judge whether the semiconductor device is good or bad, comprising:
   a semiconductor inspection unit including first to M-th semiconductor inspection circuits (M: an integer not smaller than 2) configured to perform inspections on the semiconductor device for first to M-th inspection items, respectively, the first to M-th inspection items being different from each other;
   a tester for receiving outputs from the first to M-th inspection circuits, respectively, to judge whether the semiconductor device passes or fails for each of the first to M-th inspection items, and storing judgment results for the respective first to M-th inspection items in a storage unit included in the semiconductor device;
   test judging means for reading the judgment results stored in the storage unit and judging whether the semiconductor device is good or not; and
   a marking unit for marking a semiconductor device with a bad mark based on the judgment results of the inspections made by the test judging means.

5. The semiconductor inspection device according to claim 4, wherein
   each of the first to M-th inspection items includes a plurality of detailed inspection items, and
   when the tester judges that the semiconductor device fails for any of the plurality of detailed inspection items in one of the first to M-th inspection items, the tester determines that the semiconductor device fails for the one of the first to M-th inspection items.

6. A semiconductor inspection device for inspecting a semiconductor device to judge whether the semiconductor device is good or bad, comprising:
   a semiconductor inspection unit including first to M-th semiconductor inspection circuits (M: an integer not smaller than 2) configured to perform inspections on the semiconductor device for first to M-th inspection items, respectively, the first to M-th inspection items being different from each other; and
   a tester for receiving outputs from the first to M-th inspection circuits, respectively, to judge whether the semiconductor device passes or fails for each of the first to M-th inspection items,
   a storage unit configured for storing the judgment results made by the tester for the respective first to M-th inspection items on the semiconductor device, and configured for outputting a signal indicating whether the semiconductor device is good or not based on the judgment results upon completion of the inspection for the respective first to M-th inspection items;
   test judging means for reading the signal from the storage unit, and judging whether the semiconductor device is good or not; and
   a marking unit for marking the semiconductor device with a mark indicating the semiconductor device to be bad according to the inspections made by the test judging means.

7. The semiconductor inspection device according to claim 6, wherein
   the inspections are designed to be performed in order from the first inspection item to M-th inspection item,
   the storage unit comprises:
   a latch circuit for latching the judgment results made by the tester for the first to M-th inspection items on the semiconductor device, respectively, and outputting the judgment results upon completion of the inspection for the M-th inspection items; and
   an OR gate for ORing the judgment results from the latch circuit to output the signal indicating whether the semiconductor device is good or not.

8. A semiconductor inspection device according to claim 6, wherein
   the inspections are designed to be performed in order from the first inspection items to M-th inspection items,
   the storage unit comprises:
   a latch circuit for latching the judgment results made by the tester for the first to (M−1)-th inspection items on the semiconductor device, respectively, and outputting the judgment results upon completion of the inspection for the M-th inspection items; and an OR gate for receiving the judgment results for the respective first to (M−1)-th inspection items from the latch circuit and the judgment result for M-th inspection item from the semiconductor inspection unit, and ORing the judgment results for the first to M-th inspection items to output the signal indicating whether the semiconductor device is good or not.

9. The semiconductor inspection device according to claim 6, wherein each of the first to M-th inspection items includes a plurality of detailed inspection items, and when the tester judges that the semiconductor device fails for any of the plurality of detailed inspection items in one of the first to M-th inspection items, the tester determines that the semiconductor device fails for the one of the first to M-th inspection items.

* * * * *